(12) United States Patent
Zhang et al.

(10) Patent No.: US 11,999,258 B2
(45) Date of Patent: Jun. 4, 2024

(54) METHOD FOR DETECTING STATE OF BATTERY INSTALLED IN VEHICLE, AND VEHICLE-MOUNTED BATTERY-MONITORING DEVICE

(71) Applicant: GUANGZHOU AUTOMOBILE GROUP CO., LTD., Guangzhou (CN)

(72) Inventors: Chen Zhang, San Jose, CA (US); Meng Yao, Sunnyvale, CA (US); Xiaohui Li, Sunnyvale, CA (US); Bozhi Yang, Sunnyvale, CA (US); Meng Wang, Sunnyvale, CA (US)

(73) Assignee: GUANGZHOU AUTOMOBILE GROUP CO., LTD., Guangzhou (CN)

( * ) Notice: Subject to any disclaimer, the term of this patent is extended or adjusted under 35 U.S.C. 154(b) by 412 days.

(21) Appl. No.: 17/370,162

(22) Filed: Jul. 8, 2021

(65) Prior Publication Data
US 2023/0008384 A1   Jan. 12, 2023

(51) Int. Cl.
*B60L 58/13* (2019.01)
*B60L 58/16* (2019.01)
*G01R 31/367* (2019.01)
*G01R 31/3835* (2019.01)
*G01R 31/389* (2019.01)

(52) U.S. Cl.
CPC ............ *B60L 58/13* (2019.02); *G01R 31/367* (2019.01); *G01R 31/3835* (2019.01); *G01R 31/389* (2019.01); *B60L 58/16* (2019.02); *B60L 2250/28* (2013.01)

(58) Field of Classification Search
CPC ...... B60L 58/13; B60L 58/16; B60L 2250/28; B60L 58/21; B60L 3/0046; B60L 2210/42; B60L 2240/547; B60L 2240/549; G01R 31/367; G01R 31/3835; G01R 31/389; G01R 31/392; G01R 31/396; Y02T 10/70
See application file for complete search history.

(56) References Cited

U.S. PATENT DOCUMENTS

| | | | |
|---|---|---|---|
| 8,684,596 B2 | 4/2014 | Nishi et al. | |
| 9,791,518 B2 | 10/2017 | Aoki et al. | |
| 9,817,075 B2 | 11/2017 | Sakai et al. | |
| 2011/0148361 A1* | 6/2011 | Yokotani | B60L 58/21 320/136 |
| 2014/0125284 A1* | 5/2014 | Qahouq | H02J 7/0018 320/118 |
| 2016/0226276 A1* | 8/2016 | Iwasawa | H01M 10/48 |

(Continued)

FOREIGN PATENT DOCUMENTS

| CN | 102472796 A | 5/2012 |
|---|---|---|
| CN | 104015671 A | 9/2014 |

(Continued)

*Primary Examiner* — Rami Khatib
(74) *Attorney, Agent, or Firm* — ScienBiziP, P.C.

(57) ABSTRACT

A method of detecting safe and other states of battery while electric vehicle is being driven controls an inverter to generate ripple current on the battery; ripple voltages of a plurality of battery cells are measured, voltage phase shifts between the battery cells are calculated. The battery can be analyzed as normal or otherwise according to the voltage phase shift between plurality of the battery cells. A vehicle-mounted device and a non-volatile storage medium therein, for performing the above-described method, are also disclosed.

13 Claims, 13 Drawing Sheets

(56) References Cited

U.S. PATENT DOCUMENTS

| | | | |
|---|---|---|---|
| 2019/0285683 A1* | 9/2019 | Kim | G01R 31/50 |
| 2019/0391211 A1* | 12/2019 | Meyer | G01R 31/392 |
| 2020/0256924 A1* | 8/2020 | Hoermaier | G01R 31/389 |
| 2021/0019820 A1* | 1/2021 | Matsunaga | G06F 16/955 |
| 2022/0155377 A1* | 5/2022 | Ma | H02J 3/003 |
| 2022/0200504 A1* | 6/2022 | Lee | H02P 29/68 |
| 2023/0314529 A1* | 10/2023 | Matsukawa | G01R 31/389 |
| | | | 324/430 |

FOREIGN PATENT DOCUMENTS

| | | |
|---|---|---|
| CN | 105992956 A | 10/2016 |
| CN | 106030324 A | 10/2016 |
| CN | 112731179 A | 4/2021 |
| DE | 102020110466 A1 | 10/2021 |

* cited by examiner

METHOD FOR DETECTING STATE OF BATTERY INSTALLED IN VEHICLE, AND VEHICLE-MOUNTED BATTERY-MONITORING DEVICE

FIELD

The subject matter herein generally relates to field of electric vehicles.

BACKGROUND

Electric vehicles and hybrid vehicles are widespread, and batteries are the energy source of these vehicles. In order to check battery state and estimated service life, it is necessary to regularly test impedance (alternating current (AC) resistance) of the battery.

Therefore, there is a room for improvement in such testing.

BRIEF DESCRIPTION OF THE DRAWINGS

Implementations of the present disclosure will now be described, by way of embodiments, with reference to the attached figures.

DETAILED DESCRIPTION

Figure 1:
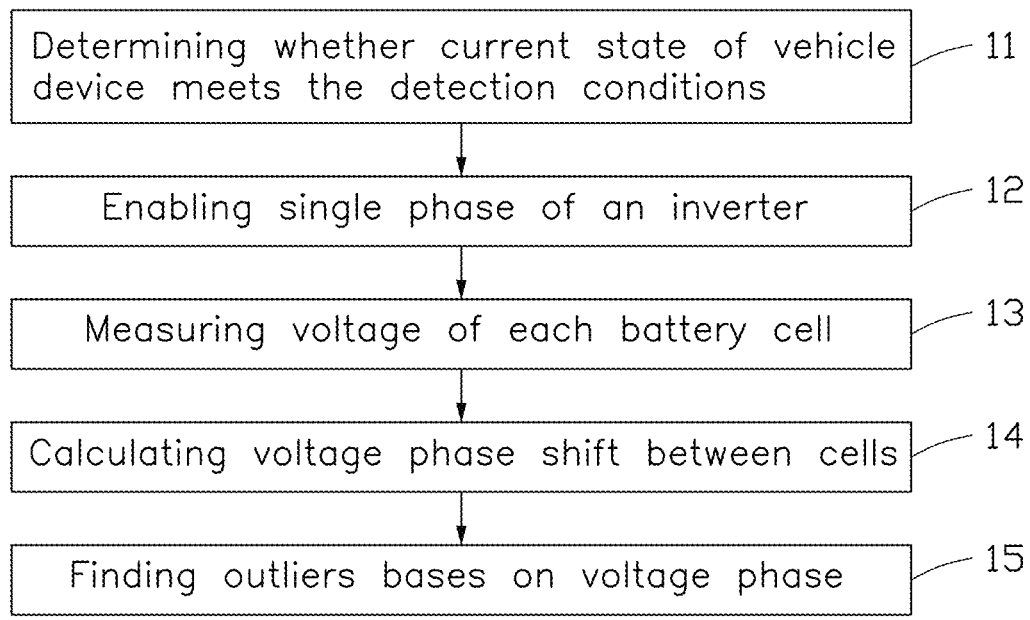
FIG. 1 is flowchart of an embodiment of a method for detecting impedance of battery according to the present disclosure.

It will be appreciated that for simplicity and clarity of illustration, where appropriate, reference numerals have been repeated among the different figures to indicate corresponding or analogous elements. Additionally, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "comprising" means "including, but not necessarily limited to"; it specifically indicates open-ended inclusion or membership in a so-described combination, group, series, and the like.

Battery may be an electrochemical system, for which an equivalent circuit of an electrochemical system can be established, an equivalent circuit connected by components such as resistances, capacitances, and inductances.

Electrochemical impedance spectroscopy (EIS) is used as a direct indicator to characterize battery states. EIS can measure composition of the equivalent circuit and the size of each component, and then use the electrochemical performance of these components to analyze the structure of the electrochemical system and the nature of the electrode process.

In some scenarios, a large number of experiments can be used to establish state of charge (SOC), state of health (SOH), state of safety (SOS) model of the battery, and the current battery health state can be inferred based on different SOC, SOH, SOS conditions and battery safety issues can be predicted.

The battery in an electric vehicle has very low internal resistance, the voltage ripple of the battery is very low with low current challenging the signal measurement.

FIG. 1 shows a flow chart of one embodiment of a method for detecting states of battery of the present disclosure.

Figure 12:
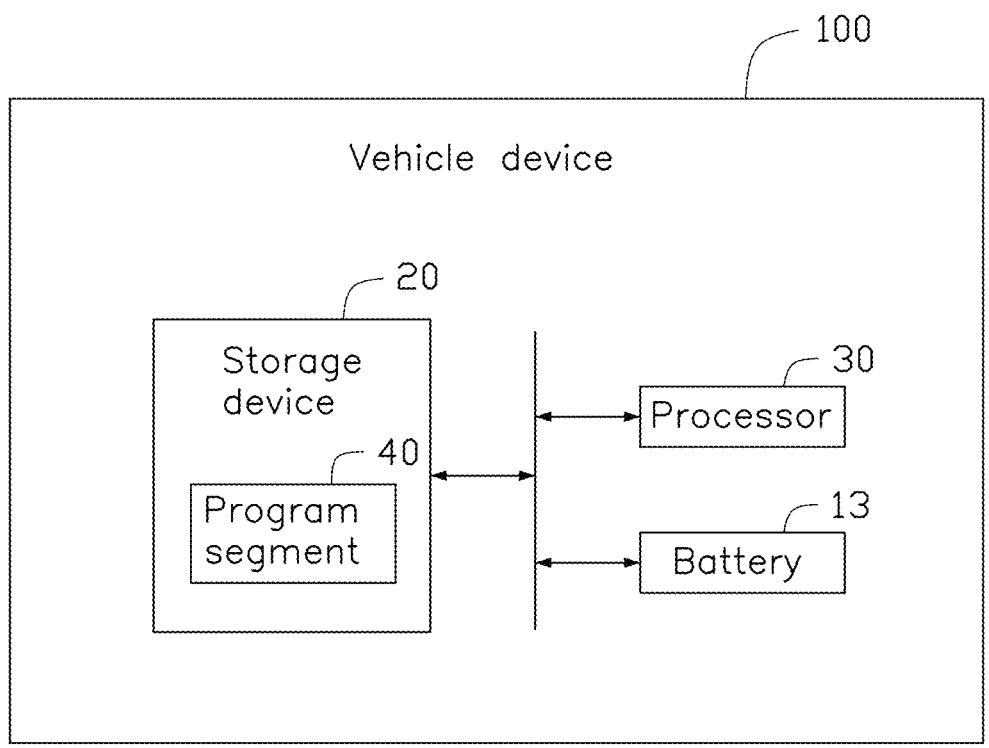
FIG. 12 is block diagrams of an embodiment of a vehicle device according to the present disclosure.

In one embodiment, the method can be applied to a vehicle device 100 (shown in FIG. 12). For a vehicle-mounted device to detect the safety of a battery 13 (shown in FIG. 12), the function for detecting provided by the method of the present disclosure can be directly integrated on the vehicle device 100, or run on the vehicle device 100 in the form of a software development kit (SDK).

The method of the present disclosure can identify battery which is in abnormal state according to a vehicle-mounted device and provide an indicator for battery safety. The method of the present disclosure generates ripple current on the battery by controlling inverter and motor. After the ripple current is generated, the ripple voltage of each battery cell can be measured.

As shown in FIG. 1, the method according to the embodiment of the present disclosure includes the following steps:

At block 11, determine whether state of the vehicle device 100 meets the detection conditions. If the vehicle device 100 meets the detection conditions, block 12 is implemented, otherwise return to block 11.

In one embodiment, a detecting system 10 (shown in FIG. 11) can determine whether the vehicle device 100 meets the requirements.

In at least one embodiment, the detecting system 10 can obtain vehicle speed and motor speed of the vehicle device 100. When the vehicle speed is within a vehicle speed range and the motor speed is within a motor speed range, a detection model can be activated. In at least one embodiment, the motor speed may be coupled with the vehicle speed or decoupled from vehicle speed.

In at least one embodiment, the detecting system 10 can determine whether throttle pedal is presently within a range. When the pedal is within the range, the detection model can be activated.

In at least one embodiment, the detecting system 10 can obtain the state of charge (SOC) of the battery 13, and determine whether the SOC of the battery 13 is within an SOC range. When the SOC of the battery 13 is within an SOC range, the detection model can be activated.

For example, if the SOC range is 20-100%, and the state of charge (SOC) of the battery 13 is 50%, the detection model can be activated. If the state of charge (SOC) of the battery 13 is 10%, the detection model cannot be activated.

In at least one embodiment, the detecting system 10 can obtain the temperature of the battery 13. When the temperature of the battery 13 is within a temperature range, the detection model can be activated.

For example, if the temperature range is −20-40 degrees, and the temperature of the battery 13 is 30 degrees, the detection model can be activated. If the temperature of the battery 13 is 50 degrees, the detection model cannot be activated.

In an implementation, the battery 13 is a rechargeable battery configured to supply electrical energy to the vehicle device 100. For example, the battery 13 may be a lead-acid battery, a nickel-cadmium battery, a nickel-hydrogen battery, a lithium-ion battery, a lithium polymer battery, or the like. The battery 13 is connected to the vehicle device 100 through the detecting system 10, such that functions such as charge, discharge, and power consumption management are implemented through the computer device system 10. The battery 13 includes a plurality of battery cells (not shown in the figures).

In at least one embodiment, the detecting system 10 can determine whether the vehicle device 100 is in speed control mode. For example, the detecting system 10 can be used to run motor in speed control mode.

At block 12, enable single phase of an inverter.

After the detection mode is activated, the detecting system 10 enables the single phase of the inverter.

Figure 2:
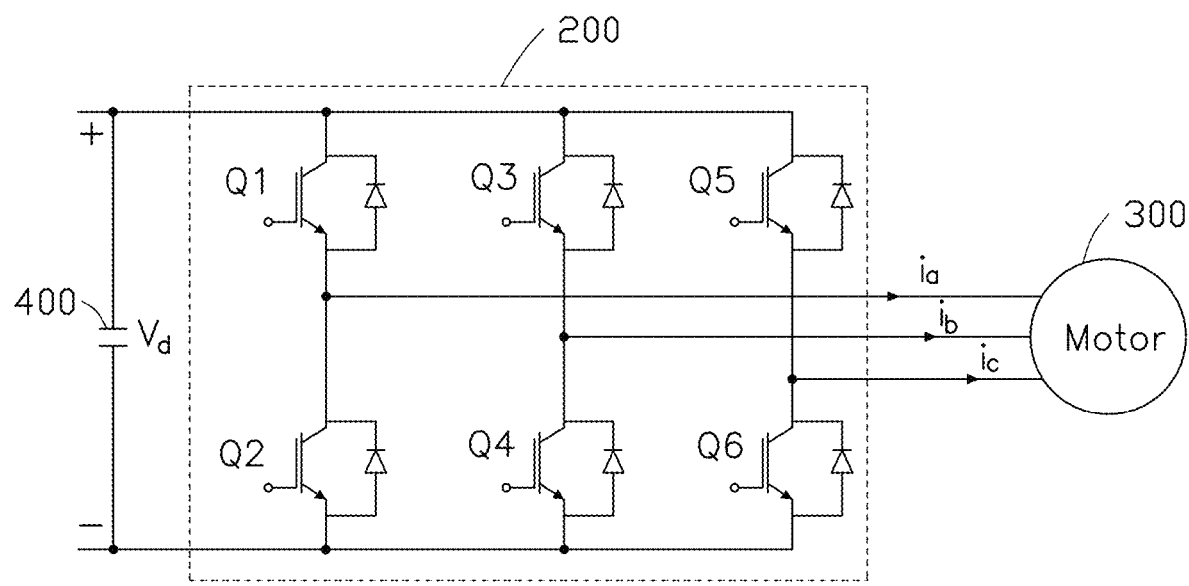
FIG. 2 is schematic diagram of ripple current generated by an inverter for battery-testing according to the present disclosure.

As shown in FIG. 2, an inverter 200 is electrically coupled between a motor 300 and a direct current (DC) source 400.

In the embodiment, the inverter 200 can include a first switch Q1, a second switch Q2, a third switch Q3, a fourth switch Q4, a fifth switch Q5, and a sixth switch Q6.

In one embodiment, a first terminal of the first switch Q1 is electrically coupled to a control circuit (not shown), a second terminal of the first switch Q1 is electrically coupled to a positive electrode of the DC source 400, a third terminal of the first switch Q1 is electrically coupled to a second terminal of the second switch Q2, and a first node P1 between the third terminal of the first switch Q1 and the second terminal of the second switch Q2 is electrically coupled to a first terminal of the motor 300. Under the control of the detecting system 10, the first node P1 can output current $i_a$ to the first terminal of the motor 300.

In one embodiment, a first terminal of the second switch Q2 is electrically coupled to the control circuit, and a third terminal of the second switch Q2 is electrically coupled to a negative electrode of the DC source 400.

In one embodiment, a first terminal of the third switch Q3 is electrically coupled to the control circuit, a second terminal of the third switch Q3 is electrically coupled to the positive electrode of the DC source 400 a third terminal of the third switch Q3 is electrically coupled to a second terminal of the fourth switch Q4, and a second node P2 between the third terminal of the third switch Q3 and the second terminal of the fourth switch Q4 is electrically coupled to a second terminal of the motor 300. Under the control of the control circuit, the second node P2 can output current $i_b$ to the second terminal of the motor 300.

In one embodiment, a first terminal of the fourth switch Q4 is electrically coupled to the control circuit, and a third terminal of the fourth switch Q4 is electrically coupled to the negative electrode of the DC source 400.

In one embodiment, a first terminal of the fifth switch Q5 is electrically coupled to the control circuit, a second terminal of the fifth switch Q5 is electrically coupled to the positive electrode of the DC source 400, a third terminal of the fifth switch Q5 is electrically coupled to a second terminal of the sixth switch Q6, and a third node P3 between the third terminal of the fifth switch Q5 and the second terminal of the sixth switch Q6 is electrically coupled to a third terminal of the motor 300. Under the control of the detecting system 10, the third node P3 can output current $i_c$ to the third terminal of the motor 300.

In one embodiment, a first terminal of the sixth switch Q6 is electrically coupled to the control circuit, and a third terminal of the sixth switch Q6 is electrically coupled to the negative electrode of the DC source 400.

As shown in in FIG. 2, the control circuit can control the status of the first switch Q1, the second switch Q2, the third switch Q3, the fourth switch Q4, the fifth switch Q5, and the sixth switch Q6, and modulate a sinusoidal current at the motor 300 out of the DC source 400. For example, the detecting system 10 may output control signal to the first switch Q1, the second switch Q2, the third switch Q3, the fourth switch Q4, the fifth switch Q5, and the sixth switch Q6.

In the embodiment, the first switch Q1 and the second switch Q2 form a leg a, the third switch Q3 and the fourth switch Q4 form a leg b, and the fifth switch Q5 and the sixth switch Q6 form a lea c.

When the state of the vehicle device 100 meets the detection conditions, the detecting system 10 activates the detection mode, and the detecting system 10 controls the inverter 200 to change 3 phases into a single phase using two legs. For example, the detecting system 10 can output a first control signal to the first switch Q1 and the second switch Q2, to turn on the first switch Q1 and the second switch Q2, the detecting system 10 can output the first control signal to the third switch Q3 and the fourth switch Q4, to turn on the third switch Q3 and the fourth switch Q4, and the detecting system 10 can output a second control signal to the fifth switch Q5 and the sixth switch Q6, to turn off the fifth switch Q5 and the sixth switch Q6.

To reduce motor noise and vibration due to unbalanced load of three phases, the detecting system 10 can alternate the choice of two legs of inverter 200 when current is approximately zero in the alternating, current (AC) cycle. When the motor 300 is rotating with high speed, this method will keep the motor 300 in approximately a balanced state.

The following, formulas (1) and (2) explain why the DC current ripples along with AC.

$$P = V * I\cos(\theta) = V_0 I_0 \sin^2 wt \cos(\theta) = V_0 I_0(\theta)\frac{1+\cos 2wt}{2} \quad \text{(formula (1))}$$

$$I_{dc} = \frac{P}{V_{dc}\eta} = \frac{V_0 I_0 \sin^2 wt \cos(\theta)}{V_{dc}\eta} = \frac{V_0 I_0 \cos(\theta)(1+\cos 2wt)}{2V_{dc}\eta} \quad \text{(formula (2))}$$

In the above formulas (1) and (2), P is the system power of a single phase, V is the AC voltage, I is the current of AC, $V_o$ is root mean square (RMS) voltage of AC, $I_o$ is RMS current of AC. $I_{dc}$ and $V_{dc}$ are the DC bus current and voltage respectively, and η is the system efficiency. w=2ϖf, and f is rotation frequency, θ is the power factor of AC.

The formulas (1) and (2) show that the DC side frequency is twice of that of AC. Therefore, the frequency of motor rotation may not be a control freedom depending on the types of vehicles and transmission of vehicle.

In a single gear electric vehicle (EV), where the motor is rigidly connected to the wheel, the speed of the motor 300 speed is not a control freedom. In a multiple gear EV or HEV system, the speed of the motor 300 may be controllable. If the speed of the motor 300 is controllable, the system will first determine the optimal ripple speed and control the motor 300 to run at the speed. The motor 300 can run in a speed control mode or in a torque control mode. In the speed control mode and the torque control mode, the motor 300 needs to maintain the speed or torque through unbalanced phase control.

It should be noted that, although the method of the present disclosure can generate a ripple voltage through 3 phase inverter/motor, the method may be used for other inverter/motors, which has 2-phase, 6-phase, or 9-phase.

In addition to completely disconnecting one phase out of 3 phases, it is also possible to precisely control the output of the waveform of each individual phase of the inverter 300, and the overall net ripple of reasonable amplitude and frequency can be created. The vehicle device 100 may be still in the normal driving mode, and the ripple can be created as desired.

The method of the present disclosure can basically control and achieve any types of waveform of different shape, frequency, and amplitude, and online measurement of battery impedance can take place while the vehicle device 100 is normal driving mode.

At block 13, measure voltage of each battery cell.

In the embodiment, the BMS measures each battery cell voltage, if the sampling time is consistent for all BMS in the vehicle device, and sampling frequency is fast enough to measure the cell voltage changes.

In one embodiment, the present disclosure provides a sampling method, the sampling rate should not be an integer multiple of the target signal period. For example, if the sampling time is 10 ms and the target frequency is 200 Hz, the ripple frequency should be controlled at 190 Hz, and avoid at 200 Hz. The following table I shows an example of adjusted frequency compared with the original target frequency.

TABLE 1 adjusted frequency and target frequency for impedance shift test

| Frequency of target signals | Period of target signals | Period target | Frequency target |
|---|---|---|---|
| 50 | 0.02 | 0.23 | 43.478 |
| 100 | 0.01 | 0.0091 | 109.89011 |
| 200 | 0.005 | 0.0049 | 204.0816 |
| 300 | 0.00033333 | 0.0035 | 285.7143 |
| 500 | 0.002 | 0.0019 | 526.3158 |
| 1000 | 0.001 | 0.0011 | 909.0909 |

Figure 3:
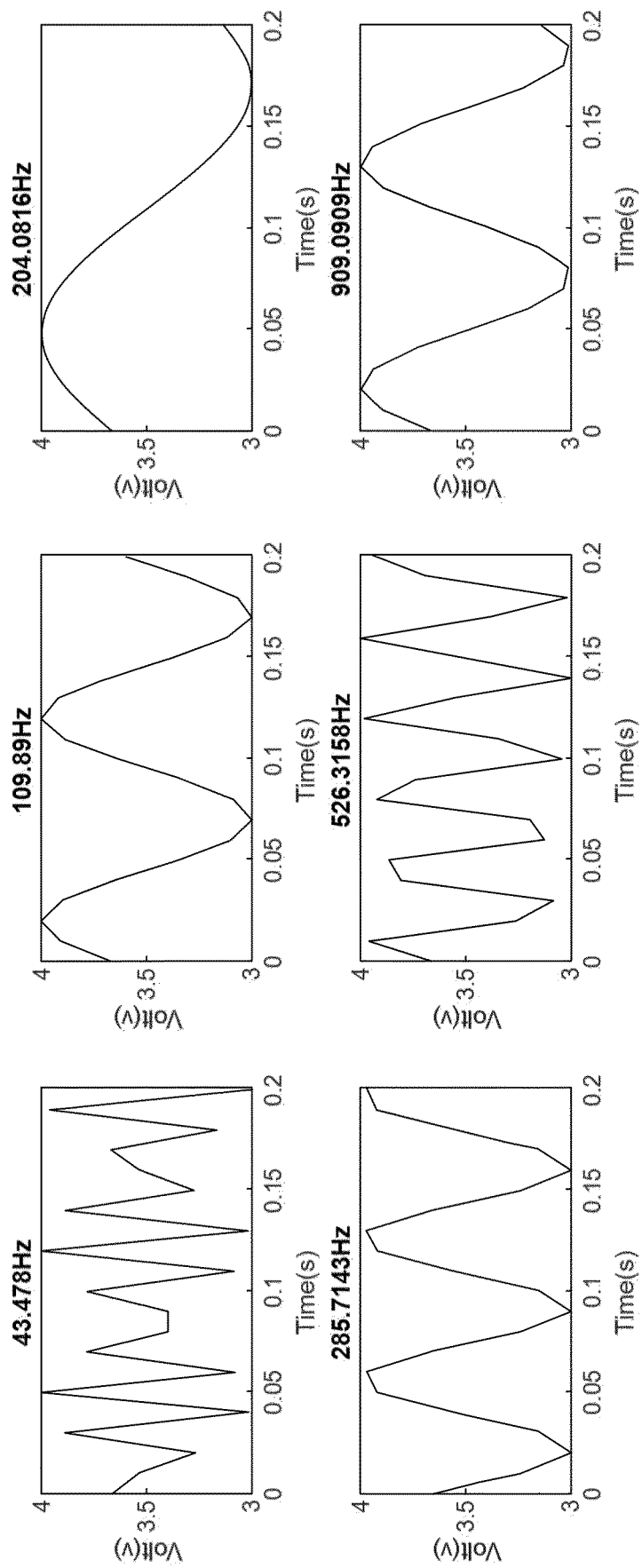
FIG. 3 is schematic diagram of the time trace of the sampled signal and the original signal at different frequencies according to the present disclosure.

FIG. 3 shows the time trace of the sampled signal and the original signal at different frequencies, and the effectiveness of the sampling method to phase shift estimation is shown through the correlation study of these sampled data with low frequency in simulation.

Figure 4:
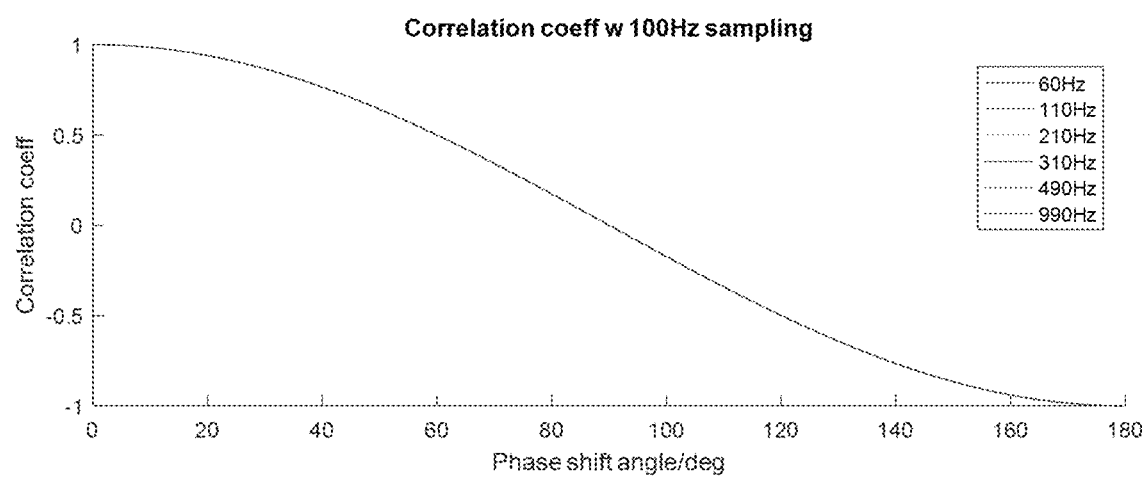
FIG. 4 is schematic diagram of the correlation study of different frequency data according to the present disclosure.

FIG. 4 shows the correlation study under different frequency data, and all curves overlap with each other. For different frequency signals, the correlation coefficient of the sampled data converges to its ideal curve-cos(phi), where phi is the phase shift angle. The sampling method mentioned in present disclosure can find the peak and valley of sampled data, which can be used for impedance magnitude calculation.

Figure 5A:
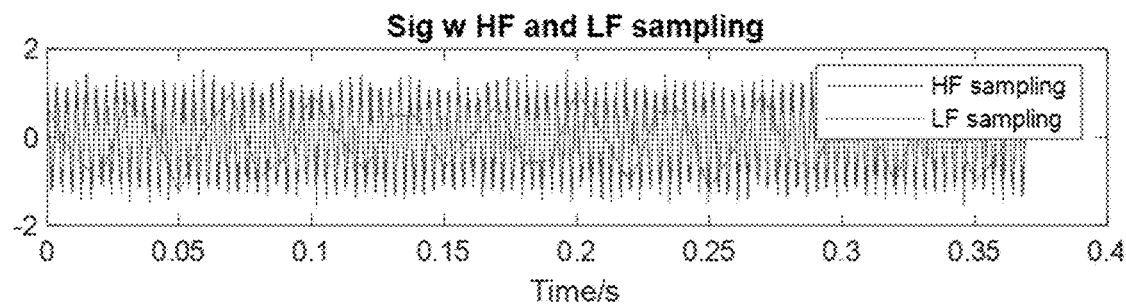
FIGS. 5*a*-5*e* are schematic diagrams of the influence of noise on angle calculation according to the present disclosure.
Figure 5B:
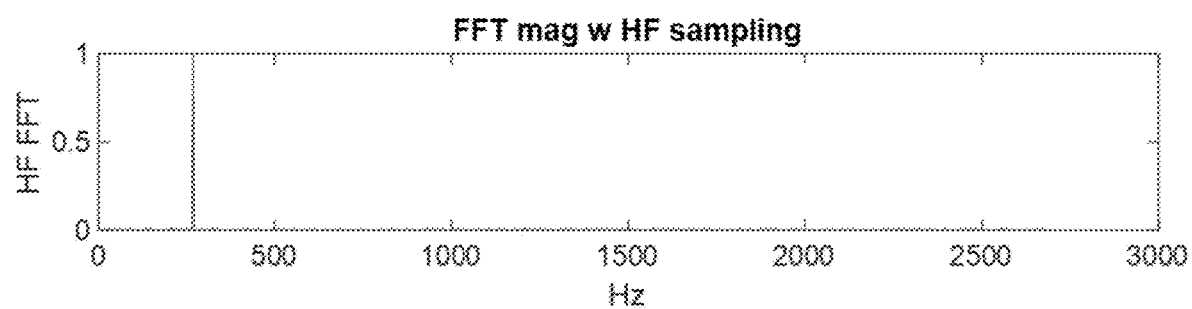
Figure 5C:
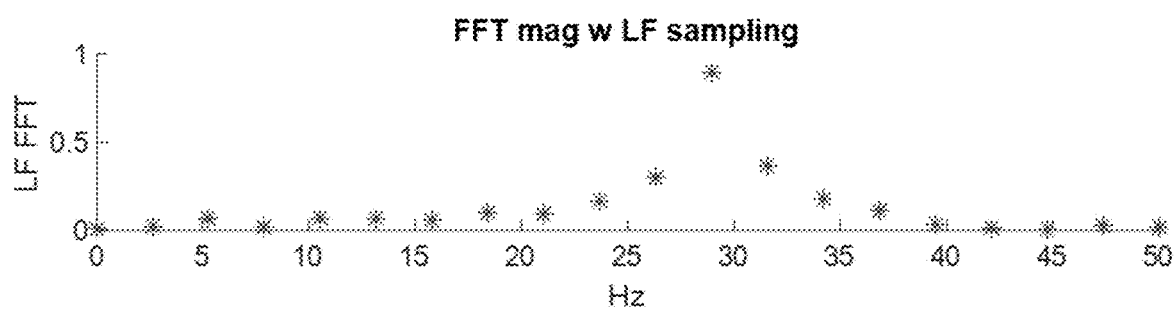
Figure 5D:
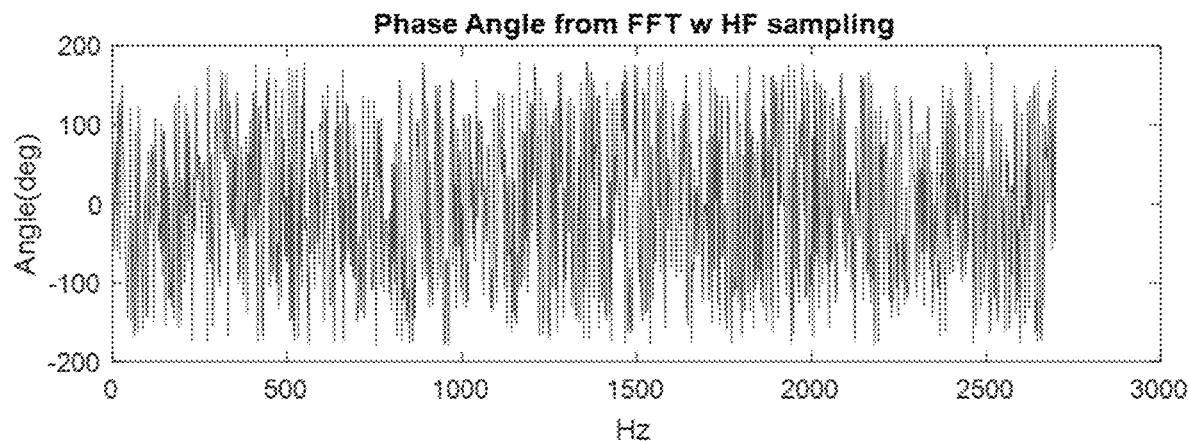
Figure 5E:
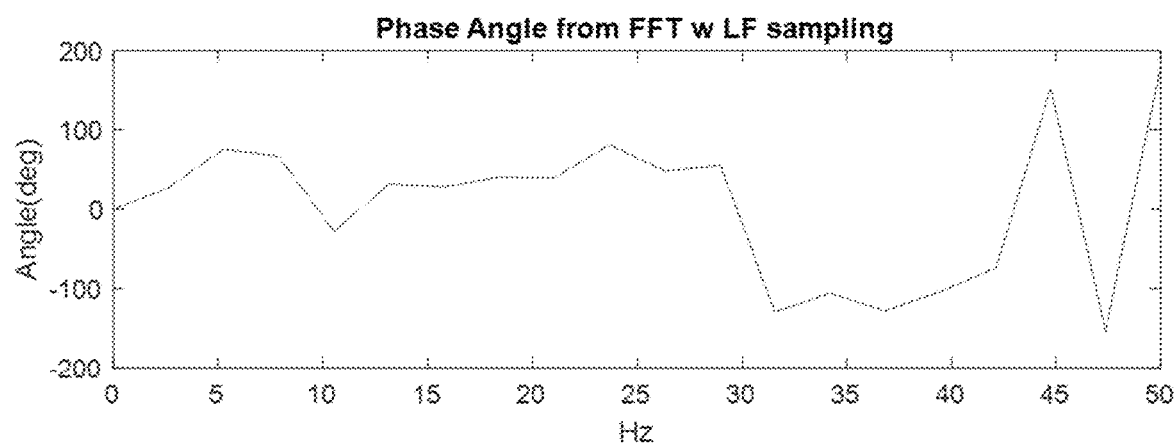

It is worth mentioning that the noise impact to the angle calculation is significant. FIG. 5a shows signals with different sampling, FIG. 5b shows magnitude of FFT with high frequency sampling, FIG. 5c shows FFT with low frequency sampling, FIG. 5d shows angle of FFT with high frequency sampling, FIG. 5e shows angle of FFT with low frequency sampling.

In the embodiment, the phase angle from FFT can be weighted through multiplication of the power density of that frequency (square of the magnitude). For example, at frequency of 10 Hz, the magnitude is 0.02 and the angle is −50 deg. The weighted angle is −50*(0.02^2)=−0.02 deg, which is very small and ruled out from the final pick. The present disclosure finds the frequency that has the maximum absolute weighted angles. The present disclosure further finds the original angle corresponding to the target frequency. The present disclosure further finds the angle difference between two target cells.

The metrics to measure the state of battery 13 are as follows, not being limited to impedance magnitude and impedance phase difference of cells. In one embodiment, formula (3) is used to calculate the battery impedance magnitude, $$\text{Imp}=(\max(v)-\min(v))/(\max(I)-\min(I)) \quad \text{(formula (3))}$$

In the above formula (3), max(v) is the maximum voltage over the measurement interval, min(v) is the minimum voltage over the measurement interval, max(I) is maximum current over the measurement intervals, and min(I) is minimum current over the measurement intervals. The current I can be positive electrode (discharge case) or negative electrode (charge case).

Figure 6:
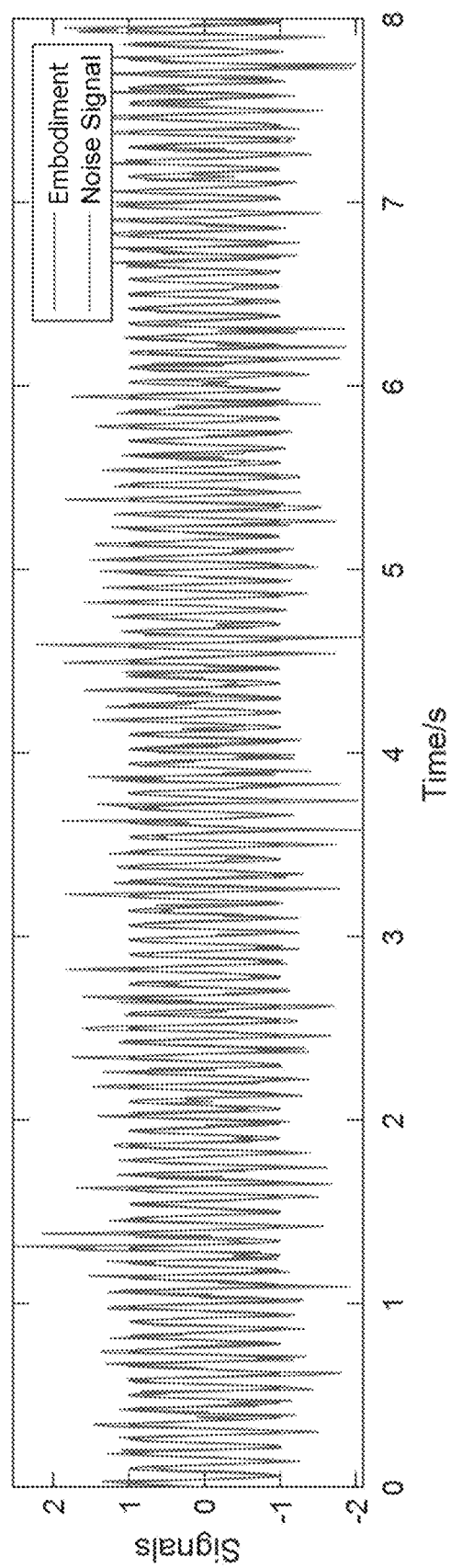
FIGS. 6-7 are schematic diagrams of impedance data processes according to the present disclosure.

As shown in FIG. 6, the minimum and maximum values of signals may create noise. Instead, the method of the present disclosure can use the average of local minimum and maximum values.

$$\overline{\max(v)} = \frac{1}{n_{loc}} \sum \max\_loc(v_i) \quad \text{(formula (4))}$$

In the above formula (4), $\overline{\max(v)}$ is the average local maximum of voltage of each cell over testing intervals, $n_{loc}$ is the total number of local maximum points, $\max\_loc(v_i)$ is the ith local maximum cell voltage.

Impedance magnitude of the battery 13 satisfies formula (5) as follows.

$$\text{Imp}=(\overline{\max(v)}-\overline{\min(v)})/(\overline{\max(I)}-\overline{\min(v)}) \quad \text{(formula (5))}$$

It should be noted that, at a low frequency, Impedance can be approximated as the DC internal resistance of battery, but at a high frequency, they are not the same.

Figure 7:
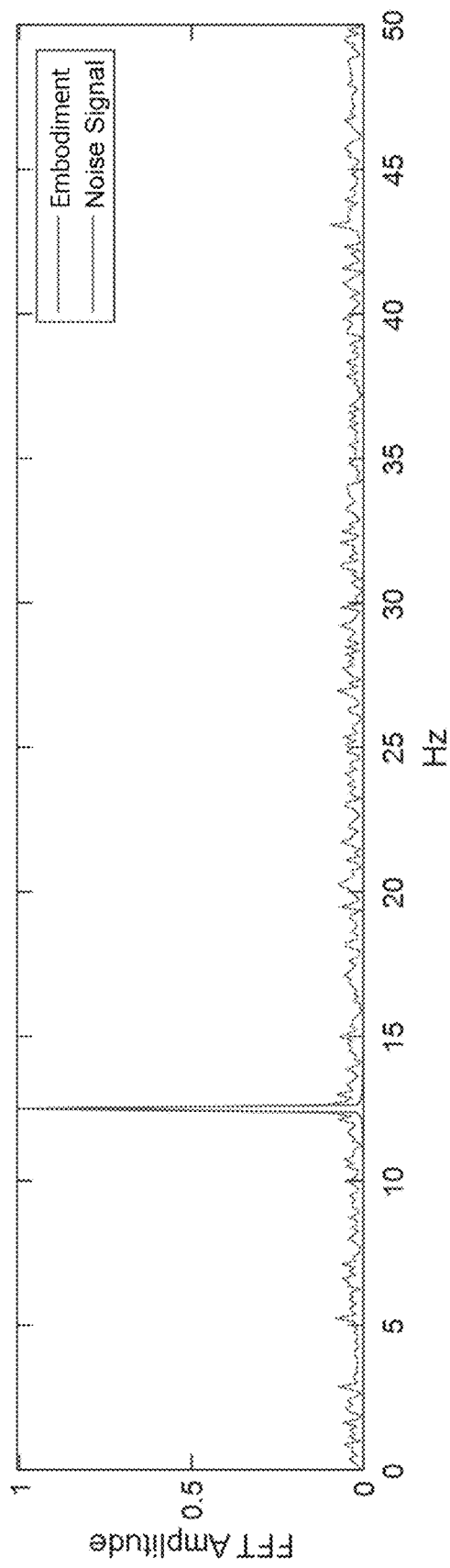

In another embodiment, as shown in FIG. 7 the impedance magnitude is calculated through fast Fourier transform (FFT). The amplitude of each frequency indicates the magnitude of that component.

It should be noted that, the method of the present disclosure can also calculate the impedance at the target frequency, and the impedance at the target frequency satisfies the following formula (6).

$$Imp = \frac{V_{Am}(f_{trg})}{I_{Am}(f_{trg})} \qquad \text{(formula (6))}$$

In the above formula (6), $v_{Am}(F_{erg})$ is the amplitude of each cell voltage's FFT at the tested frequency (known and given), $f_{erg}$, and $I_{Am}(f_{erg})$ the amplitude of battery current at the tested frequency (known and given) $f_{erg}$.

At block 14, calculate voltage phase shift between cells.

In the embodiment, the second metrics is the impedance phase differences among cells.

Figure 8:
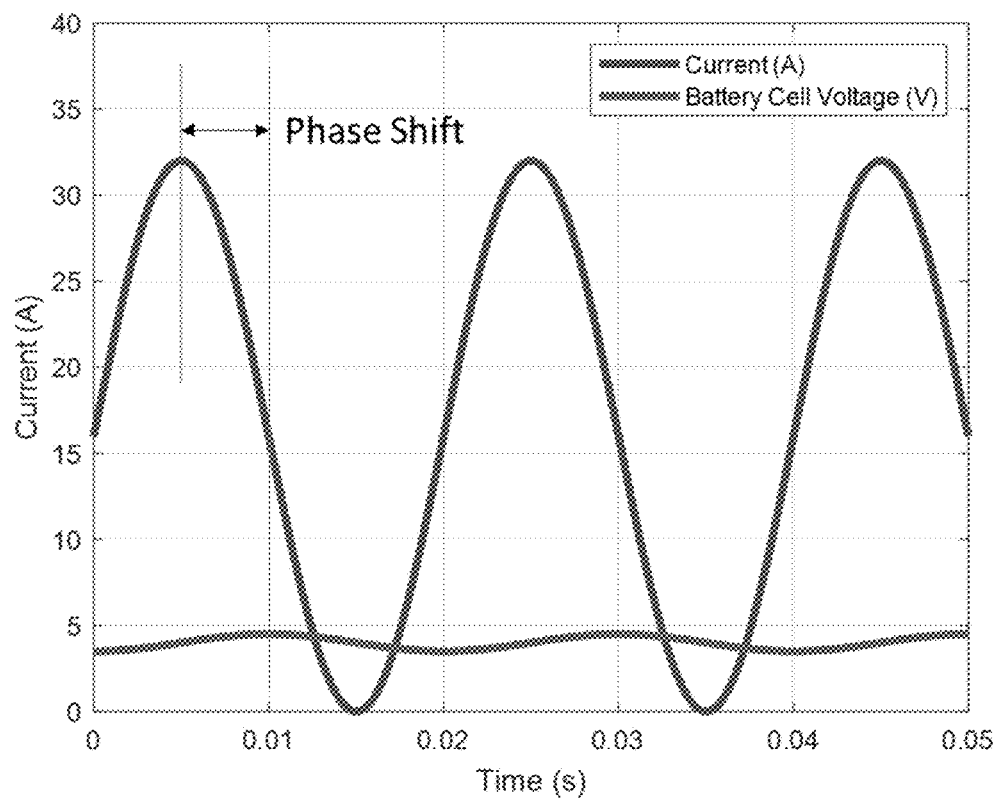
FIG. 8 is schematic diagram of phase shift for one battery cell between current and voltage according to the present disclosure.
Figure 9:
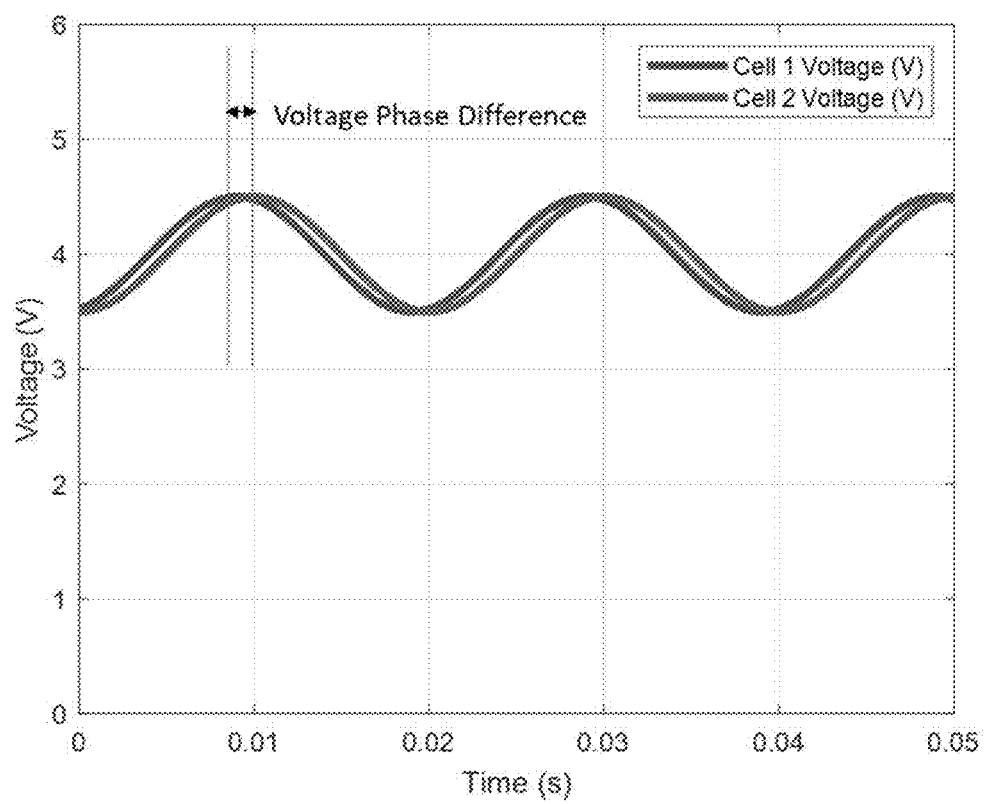
FIG. 9 is schematic diagram of voltage phase comparison between two battery cells according to the present disclosure.

FIG. 8 shows the phase shift for one cell between current and voltage when the battery 1 is charging, and each cell may show slightly different voltage curve in response to the same current signals, FIG. 9 shows an example of voltage phase comparison between two cells when the battery 13 is charging.

The embodiment of the present disclosure may calculate the phase difference among cells through the following formula (7).

$$R_{i,j} = \frac{\sum (V_i - \overline{V}_i)(V_j - \overline{V}_j)}{\sqrt{\sum (V_i - \overline{V}_i)^2 (V_j - \overline{V}_j)^2}} \qquad \text{(formula (7))}$$

In the above formula (7), $R_{i,j}$ is the correlation coefficient of the linear relationship between voltage $V_i$ and voltage $V_j$. $V_i$ is the voltage of the cell I, $V_j$ is the voltage of cell j, and $\overline{V}$ is the mean voltage of the cell (i or j).

The phase difference between two cells is calculated by the following formula 8.

$$\theta_{shift} = \arccos(R_{i,j}) \qquad \text{(formula (8))}$$

In another embodiment, the phase shift can be calculated through fast Fourier transform (FFT), and the angle of each frequency can indicate the phase of that component. The phase difference of two cells can indicate the phase shift.

Figure 10:
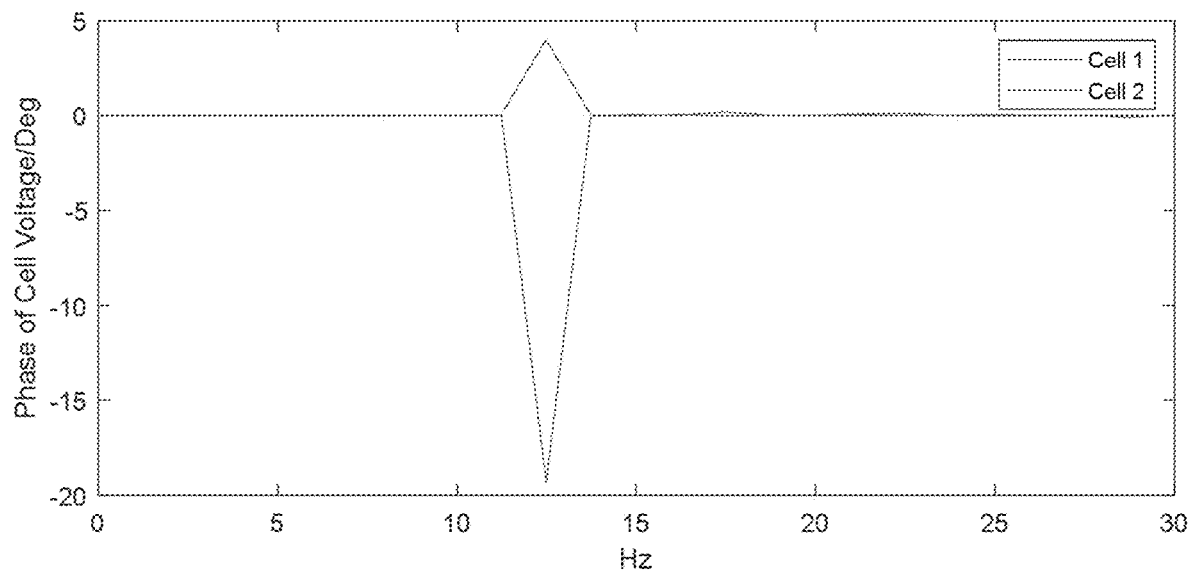
FIG. 10 is schematic diagram of signal phase difference between battery cells according to the present disclosure.

As shown in FIG. 10 the results of angle from FFT may sometimes be too noisy, and the data process only compares the phase angle for the target frequency.

At block 15, outlier bases on voltage phase are found.

In the embodiment, cell voltage phase difference can be calculated locally by BMS or by the cloud.

For example, BMS can measure cells' voltage phase of the battery 13 through the same board, the average phase shift is calculated by removing 1-2 outliers, and the average voltage phase in this small group is compared with other groups in the battery 13. Therefore, possible inconsistencies of time synchronization on different boards may be compensated for, and the outliers found in the comparison can indicate an abnormal battery cell.

The calculated voltage phase and the abnormal battery cell characteristics can be uploaded to cloud memory, and big data will help to analyze those data among vehicle fleet and cross-check with the abnormalities found by BMS in the vehicle device.

For example, the measured voltage for each battery cell can be uploaded through vehicle's communication module (for example, T-BOX) to cloud server. It should be noted that big data analysis in the cloud server is applied to evaluate battery voltage phase for the whole vehicle fleet, through which some cells having different behaviors from others can be found. The outliers may have high risk, since phase shift may change because of temperature changes during thermal runaway.

Figure 11:
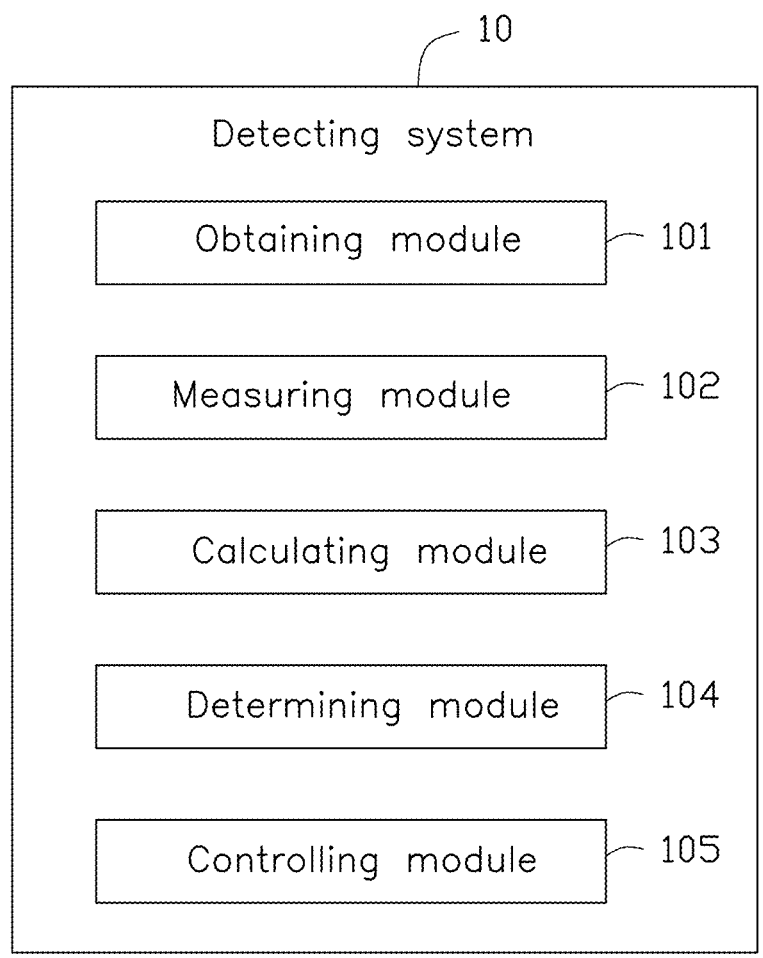
FIG. 11 is a block diagram of an embodiment of a system for detecting impedance of battery according to the present disclosure.

FIG. 11 illustrates the detecting system 10 in accordance with an embodiment of the present disclosure.

The detecting system 100 operates in the vehicle device 100. The detecting system 10 can include a plurality of modules. The plurality of modules can comprise computerized instructions in a form of one or more computer-readable programs that can be stored in a non-transitory computer-readable medium (e.g., a storage device of the computer device), and executed by at least one processor of the vehicle device to implement detection function (described in detail in FIG. 1).

The detecting system 10 may include functional modules consisting of program code. The functional modules can include an obtaining module 101, a measuring module 102, a calculating module 103, a determining module 104, and a controlling module 105.

The obtaining module 101 is configured to obtain the vehicle speed and motor speed of the vehicle device 100. The obtaining module 101 is configured to obtain the state of charge (SOC) of the battery 13.

The obtaining module 101 is configured to obtain the temperature of the battery 13.

The determining module 104 is configured to determine whether the current state of the vehicle device 100 meets the detection conditions. The determining module 104 is configured to determine whether the vehicle device 100 meets the requirements.

The determining module 104 is configured to determine whether pedal is presently within a range. The determining module 104 is configured to determine whether the vehicle device 100 is in speed control mode.

The controlling module 105 is configured to control the state of the inverter 200 and the motor 300.

In one embodiment, the controlling module 105 is configured to control the working status of the first switch Q1, the second switch Q2, the third switch Q3, the fourth switch Q4, the fifth switch Q5, and the sixth switch Q6, and modulate a sinusoidal current at the motor 300 out of the DC source 400.

The measuring module 102 is configured to measure voltage of each battery cell.

The calculating module 103 is configured to calculate voltage phase shift between cells.

The controlling module 105 is configured to find outliers bases on voltage phase.

FIG. 12 illustrate a vehicle device 100 in accordance with an embodiment of the present disclosure.

In one embodiment, the vehicle device 100 can be an electric vehicle. In another embodiment, the vehicle device 100 can be a hybrid vehicle.

The vehicle device 100 can further include, but is not limited to, a battery 13 a storage device 20, at least one processor 30, and a program segment 40 stored in the storage device 20. The processor 30 may execute the program code of program segment 40 to implement blocks 11-15 in method shown in FIG. 1. The processor 30 may execute the program code of program segment 40 to implement the functions of a detecting system 100 for detecting battery shown in FIG. 8.

The modules 101-105 include computer instructions or codes in form of one or more programs that may be stored in the storage device 20, and which are executed by the at least one processor 30. In other embodiment, the modules 101-105 may also be a program instruction or firmware that is embedded in the processor 30.

The block diagram merely shows an example of the vehicle device 100 and does not constitute a limitation to the vehicle device 100. In other examples, more or less components than those illustrated may be included, or some components may be combined, or different components used. For example, the vehicle device 100 may also include input and output devices, a network access devices, a bus, and the like.

The processor 30 may be a central processing unit (CPU), or may be another general purpose processor, a digital signal processor (DSP), an application specific integrated circuit (ASIC), a Field-Programmable gate array (FPGA) or other programmable logic device, a transistor logic device, a discrete hardware component. The general purpose processor may be a microprocessor. The processor 30 may also be any conventional processor. The processor 30 is a control center of the vehicle device 100. The processor 30 connects the parts of vehicle device 100 by using various interfaces and lines.

The storage device 20 can be used to store the program segment 40. The processor 30 operates or executes the program segment stored in the storage device 20 and recalls data stored in the storage device 20, and implements various functions of the vehicle device 100. The storage device 20 may mainly include a storage program area and a storage data area, the storage program area may store an operating system, an application (such as sound playback and image playback) required for at least one function. The storage data area may store data created.

The storage device 20 may include a RAM and may also include non-volatile memory such as a hard disk, a memory, a plug-in hard disk, a smart memory card (SMC), and a Secure Digital (SD) card, a flash card, at least one disk storage device, flash device, or other volatile or non-volatile solid-state storage device.

The modules and units integrated by the vehicle device 100, if implemented in the form of software functional units and sold or used as separate products, may be stored in a computer readable storage medium. Based on such understanding, the present disclosure implements all or part of the processes in the foregoing embodiments, and the purposes of the disclosure may also be implemented and achieved by a computer program instructing related hardware. The computer program may be stored in a computer readable storage medium. The steps of the various method embodiments described above may be implemented by a computer program when executed by a processor. The computer program includes a computer program code, which may be in the form of source code, object code form, executable file, or some intermediate form. The computer readable medium may include any entity or device capable of carrying the computer program code, a recording medium, a USB flash drive, a removable hard disk, a magnetic disk, an optical disk, a computer memory, a read-only memory (ROM), a random access memory (RAM), electrical carrier signals, telecommunications signals, and software distribution media.

Even though numerous characteristics and advantages of the present technology have been set forth in the foregoing description, together with details of the structure and function of the present disclosure, the disclosure is illustrative only, and changes may be made in the detail, especially in matters of shape, size, and arrangement of the parts within the principles of the present disclosure, up to and including the full extent established by the broad general meaning of the terms used in the claims. It will therefore be appreciated that the exemplary embodiments described above may be modified within the scope of the claims.

What is claimed is:

1. A method of detecting state of a battery loaded on a vehicle device comprising:
   determining whether a state of the vehicle device meets detection conditions in real time;
   obtaining a vehicle speed and a motor speed of the vehicle device, determining whether the vehicle speed is within a vehicle speed range and the motor speed is within a motor speed range;
   detecting the state of the battery if the vehicle speed is determined to be within the vehicle speed range and the motor speed is determined to be within the motor speed range;
   controlling an inverter to generate ripple currents on the battery;
   measuring ripple voltages of a plurality of battery cells in response to the ripple currents;
   calculating voltage phase shifts between the battery cells from the measured ripple voltages; and
   analyzing the calculated voltage phase shifts between plurality of the battery cells, and determining if the battery is operating in a normal state.

2. The method according to claim 1, further comprising:
   determining whether a driver pedal is within a threshold range; and
   detecting the state of the battery if the driver pedal is determined to be within the threshold range.

3. The method according to claim 1, further comprising:
   obtaining a state of charge (SOC) of the battery;
   determining whether the SOC of the battery is within a SOC range; and
   detecting the state of the battery if the SOC of the battery is determined to be within the SOC range.

4. The method according to claim 1, further comprising:
   obtaining a temperature of the battery;
   determining whether the temperature of the battery is within a temperature range; and
   detecting the state of the battery if the temperature of the battery is determined to be within the temperature range.

5. The method according to claim 1, further comprising:
   uploading a voltage phase and abnormal battery cells information to a cloud server.

6. A vehicle device, comprising:
   a battery;
   a storage device; and
   at least one processor, wherein the storage device stores one or more programs, when executed by the at least one processor, the one or more programs cause the at least one processor to:
   determine whether current state of the vehicle device meets detection conditions;
   obtain vehicle speed and motor speed of the vehicle device;
   determine whether vehicle speed is within a vehicle speed range and the motor speed is within a motor speed range;
   detect a state of the battery if the vehicle speed is within the vehicle speed range and the motor speed is within the motor speed range;
   control an inverter to generate ripple current on the battery;
   measure ripple voltage of a plurality of battery cells;

calculate voltage phase shift between the battery cells; and analyze whether the battery is normal according to the voltage phase shift between plurality of the battery cells.

7. The vehicle device according to claim 6, wherein the at least one processor is further caused to:
determine whether driver pedal is within the threshold range; and
detect the state of the battery if the driver pedal is within the threshold range.

8. The vehicle device according to claim 6, wherein the at least one processor is further caused to:
obtain state of charge (SOC) of the battery;
determine whether the SOC of the battery is within a SOC range; and
detect the state of the battery if the SOC of the battery is within the SOC range.

9. The vehicle device according to claim 6, wherein the at least one processor is further caused to:
obtain temperature of the battery;
determine whether the temperature of the battery is within a temperature range; and
detect the state of the battery if the temperature of the battery is within the temperature range.

10. A non-transitory storage medium having stored thereon instructions that, when executed by a processor of a computer device installed in a vehicle device, causes the processor to perform an analyzing method, wherein the method comprises:
determining whether current state of the vehicle device meets detection conditions;
obtaining vehicle speed and motor speed of the vehicle device;
determining whether vehicle speed is within a vehicle speed range and the motor speed is within a motor speed range; and
detecting a state of a battery if the vehicle speed is within the vehicle speed range and the motor speed is within the motor speed range;
controlling an inverter to generate ripple current on the battery;
measuring ripple voltage of a plurality of battery cells;
calculating voltage phase shift between the battery cells; and
analyzing whether the battery is normal according to the voltage phase shift between plurality of the battery cells.

11. The non-transitory storage medium according to claim 10, further comprising:
determining whether driver pedal is within the threshold range; and
detecting the state of the battery if the driver pedal is within the threshold range.

12. The non-transitory storage medium according to claim 10, further comprising:
obtaining state of charge (SOC) of the battery;
determining whether the SOC of the battery is within a SOC range; and
detecting the state of the battery if the SOC of the battery is within the SOC range.

13. The non-transitory storage medium according to claim 10, further comprising:
obtaining temperature of the battery;
determining whether the temperature of the battery is within a temperature range; and
detecting the state of the battery if the temperature of the battery is within the temperature range.

* * * * *